United States Patent
Coffer

(10) Patent No.: US 7,442,575 B2
(45) Date of Patent: Oct. 28, 2008

(54) METHOD OF MANUFACTURING SEMICONDUCTOR NANOWIRES

(75) Inventor: Jeffery L. Coffer, Fort Worth, TX (US)

(73) Assignee: Texas Christian University, Fort Worth, TX (US)

(*) Notice: Subject to any disclaimer, the term of this patent is extended or adjusted under 35 U.S.C. 154(b) by 0 days.

(21) Appl. No.: 11/540,993

(22) Filed: Sep. 29, 2006

(65) Prior Publication Data

US 2008/0081439 A1 Apr. 3, 2008

(51) Int. Cl.
*H01L 21/00* (2006.01)
(52) U.S. Cl. ............... 438/105; 257/14; 977/762
(58) Field of Classification Search ............. 438/105; 257/14; 424/423; 435/243; 977/762
See application file for complete search history.

(56) References Cited

U.S. PATENT DOCUMENTS

| | | | | |
|---|---|---|---|---|
| 6,659,292 | B2 | 5/2003 | Coffer | 204/164 |
| 6,872,645 | B2 | 3/2005 | Duan et al. | 438/584 |
| 6,878,871 | B2 | 4/2005 | Scher et al. | 136/252 |
| 6,882,051 | B2* | 4/2005 | Majumdar et al. | 257/746 |
| 6,949,206 | B2 | 9/2005 | Whiteford et al. | 252/500 |
| 6,962,823 | B2 | 11/2005 | Empedocles et al. | 438/3 |
| 7,057,881 | B2 | 6/2006 | Chow et al. | 361/508 |
| 7,064,372 | B2 | 6/2006 | Duan et al. | 257/296 |
| 7,067,867 | B2 | 6/2006 | Duan et al. | 257/296 |
| 7,068,898 | B2 | 6/2006 | Buretea et al. | 385/123 |
| 7,074,294 | B2 | 7/2006 | Dubrow | 156/276 |
| 7,083,104 | B1 | 8/2006 | Empedocles et al. | 235/491 |
| 7,087,033 | B2 | 8/2006 | Brugger et al. | 604/4.01 |
| 7,182,812 | B2* | 2/2007 | Sunkara et al. | 117/103 |
| 2002/0172820 | A1* | 11/2002 | Majumdar et al. | 428/357 |
| 2004/0110003 | A1* | 6/2004 | Cumings et al. | 428/399 |
| 2004/0111141 | A1* | 6/2004 | Brabec et al. | 607/119 |
| 2005/0011431 | A1* | 1/2005 | Samuelson et al. | 117/40 |
| 2007/0003467 | A1* | 1/2007 | Sunkara et al. | 423/348 |
| 2007/0095276 | A1* | 5/2007 | Sunkara et al. | 117/103 |
| 2007/0164270 | A1* | 7/2007 | Majumdar et al. | 257/14 |
| 2007/0207186 | A1* | 9/2007 | Scanlon et al. | 424/424 |
| 2007/0274895 | A1* | 11/2007 | Jesih et al. | 423/462 |
| 2008/0044451 | A1* | 2/2008 | Steinmuller-Nethl et al. | 424/423 |

OTHER PUBLICATIONS

Civale, et al.; "Aspects of Silicon Nanowire Synthesis by Aluminum-Catalyzed Vapor-Liquid-Solid Mechanism"; pp. 692-696; Kalvi Institute of Nanoscience, Delft University, The Netherlands.

* cited by examiner

*Primary Examiner*—Fernando L Toledo
(74) *Attorney, Agent, or Firm*—Charles D. Gunter, Jr.

(57) ABSTRACT

A method is shown for manufacturing silicon semiconductor nanowires on graphite cloth conducting substrates. The nanowires are grown on the substrate by first depositing a thin gold film on the graphite cloth using RF sputtering. The substrate structure is then exposed to dilute silane, resulting in a uniform coating of Si nanowires on the cloth. A method is also shown for growing calcified mineral phases on such nanowire surfaces as well as for the incorporation of anti-osteoporotic drugs or anti-bacterial agents onto the surface of the nanowires. Lastly, a method is shown for promoting the growth of bone-forming cells onto the nanowire materials by exposing specially treated nanowires to bone marrow cells.

15 Claims, 3 Drawing Sheets

METHOD OF MANUFACTURING SEMICONDUCTOR NANOWIRES

BACKGROUND OF THE INVENTION

1. Field of the Invention

The present invention relates generally to the manufacture of semiconductor nanowires and, more specifically, to the manufacture of silicon nanowires on conducting substrates, and to selected applications and end uses of the resulting structures.

2. Description of the Prior Art

Nanostructures, which include but are not limited to nanofibers, nanowires and nanocrystals, have potential uses in a variety of fields including electrical, chemical and optical applications. Likewise, these unique structures appear to offer great potential advantages in the biomedical field. Researchers at Texas Christian University and others are presently developing semiconductor nanowires, specifically silicon (Si) nanowires, for applications relevant to biomaterials in general, and orthopedics in particular.

Nanomaterials are currently known to be used in a variety of applications in the fields mentioned above. As an example of the current state of the art, U.S. Pat. No. 's7,087,833; 7,087,832; and 7,083,104, all assigned to Nanosys, Inc., of Palo Alto, Calif., teach the manufacture of nanostructure and nanocomposite materials, many of which have potential electronic end applications. For example, U.S. Pat. No. 7,083,104, teaches the use of semiconductor devices which incorporate thin films of nanowires for applications in the field of macroelectronics. The teachings are specifically directed to the manufacture of an adjustable phase shifter, as well as to applications involving a radio frequency identification tag. In applications such as these, electrical contacts or switches usually include a transistor that is formed by a film of nanowires.

Silicon nanowires also have potential technological benefits in the field of biomaterials, and specifically in the field of orthopedics. For example, such nanowire structures could be transferred to existing tissue engineering platforms. There is a long standing need to create to create biocompatible devices which would aid in bone growth. Phosphates are a component of numerous biomaterials used for drug delivery and tissue engineering. For example, calcium phosphates, in the form of powders and solid scaffolds, have been used to efficiently regenerate or promote bone formation. Techniques for promoting the subsequent growth of calcified mineral phases on nanowire surfaces offer the possibility of producing bone-like materials with a wide range of end uses. Similarly, the surface modification of such nanowires with orthopedically relevant anti-osteoporodic drug moieties or anti-bacterial components offer a variety of technological benefits in various medical applications.

One prior art technique for depositing bone-like layers of calcium phosphate on substrates which does not involve nanowires is that which is described in U.S. Pat. No. 6,569,292, "Method and Device For Forming A Calcium Phosphate Film On A Substrate", issued May 27, 2003, to Jeffery L. Coffer. This patent teaches a technique for applying an inorganic film to an isolating substrate, such as silicon substrate, for intended use in the body. In particular, the patent teaches a technique for forming a calcium phosphate film on a substrate for applications involving the dispensing of medicinally active agents inside a living being. The silicon substrate is first exposed to calcium phosphate to form a coating. An electrode is then positioned a predetermined distance from the coating on the substrate and a current is generated between the electrode and the substrate. The resulting current creates a spark which forms a fixed calcium phosphate film having a desired morphology and thickness within the selected region of the substrate.

While this technique provides a very simple way to produce a calcium phosphate film on a silicon substrate, the growth of calcified mineral phases on nanowire surfaces would result in structures offering increased reactivity or efficiency for many applications due primarily to the increased surface area of the substrates involved.

Several different techniques are known in the prior art for producing nanowires of the general type under consideration. These include template-assisted synthesis, laser ablation, chemical vapor deposition (CVD), electrochemical deposition, and the vapor-liquid-solid (VLS) technique. Using these different techniques, a large variety of semiconducting nanowires have been produced including indium phosphate, gallium nitride, germanium and silicon nanowires. Most of the recent successful semiconducting nanowire growth has been based on the VLS technique.

The VLS method was developed in the 1960's and has seen various improvements in recent years. Some of these improvements involve the metallic nanoparticles used in the process, i.e., the metallic eutectic particles, generally gold, aluminum, iron, cobalt, manganese or silver used to catalyze silicon nanowire growth. Gold is probably the most common metallic eutectic particle utilized, although aluminum is a standard metal in silicon process lines and provides an alternative for silicon nanowire growth. To briefly describe the VLS method, nanosized metallic particles are first formed on a substrate in a nucleation stage. These particles can be formed, for example, by ablation or by annealing a very thin metallic film above the eutectic temperature in order to break it into discrete islands. Then the source material carrier gas (typically $SiH_4$ or $SiCl_4$) is introduced into a chamber maintained above the eutectic temperature. The background pressure is used to control the catalyst size, and the temperature of the tube has to be adjusted in order to maintain the catalyst in the liquid state. Next, the silicon diffuses through the catalyst droplets. When the eutectic alloy has become saturated, silicon precipitates at the liquid-solid interface. Anistropic growth continues while the gas flow is maintained, resulting in the elongation and growth of the nanowire.

While the above technique can be used to produce silicon nanowires of high purity, the process is complicated, requires fairly extensive laboratory equipment, and requires careful monitoring of several different parameters.

A need exists, therefore, for a process for producing semiconductor nanowire, and specifically silicon nanowires which process is simpler in design and more economical in practice.

A need also exists for a process for promoting the high surface area growth of semiconductor nanowires on a conducting substrate and which would allow transfer to existing tissue engineering platforms.

A need also exists for an improved process to promote the subsequent uniform growth of calcified mineral phases on such nanowire surfaces.

A need also exists for an improved process for the control of phase identity of such mineral films through proper surface modification of the nanowires.

A need also exists for a process for surface modification of nanowires so produced, with orthopedically relevant drugs or medicinal components.

A need also exists for a process for producing such surfaces capable of such diverse uses as facilitating the adsorption and mediating the proliferation of mesenchymal stem cells, such cells being capable of differentiation into bone forming osteoblast cells.

SUMMARY OF THE INVENTION

It is therefore an object of the present invention to provide an improved method of manufacturing semiconductor nanowires, specifically silicon nanowires, on conducting substrates and to develop techniques for promoting a uniform growth of calcified minerals associated with bone onto such nanowire surfaces, allowing transfer into existing tissue engineering platforms.

In the method of the invention, a selected graphite material is provided as a starting substrate. The semiconductor nanowire is then grown onto the graphite substrate. The semiconductor nanowire is then detached from the substrate. In the preferred method, the selected graphite starting material is a graphite cloth and a silicon nanowire is produced by exposing the graphite cloth to a silane resulting in a uniform coating of Si nanowires on the graphite cloth. The graphite cloth is typically treated with a gold sputtering process prior to contact with the silane to form a thin film coating on the graphite substrate. One technique for detaching the nanowires from the substrate is by pressing and pulling with a porous polymeric body such as a porous polycaprolactone sponge.

In one form of the invention, a method is provided for producing a uniform growth of calcified mineral phases on the nanowire surfaces which were produced as previously described. In this method, a selected graphite material is again provided as a starting substrate and the semiconductor nanowires are grown onto the starting substrate, followed by detaching the nanowires from the substrate. The detached nanowires are exposed to a media solution formed of selected ingredients which promote the growth of a desired mineral film uniformly covering the nanowires.

In one preferred form of the method, a known electrical bias is applied to the media solution for a selected time interval sufficient to promote the growth of the desired calcified mineral phase on the nanowire surfaces. The electrical bias is then removed at the end of the selected time interval, followed by allowing the nanowires to soak in the media solution to produce a specimen sample and thereafter removing the sample and allowing the sample to dry. Preferred media solutions include acellular simulated body fluid (SBR), $CaCl_2$ in solution, and calcium phosphate in solution. In one particularly preferred form of the invention, the desired mineral film is calcium phosphate, the film subsequently being used as a bone medium.

In another aspect of the method of the invention, the detached nanowires are again exposed to a media solution formed of preselected ingredients which promote the growth of a desired mineral film uniformly covering the nanowires. A desired orthopedically relevant drug moiety and/or anti-bacterial component is incorporated within the mineral film. The desired orthopedically relevant drug moiety and/or anti-bacterial component can be incorporated into the mineral film by soaking the nanowire in a solution of the drug moiety or anti-bacterial component.

In yet another aspect of the invention, a method is provided for promoting the growth of bone-forming cells onto a synthetic substrate. A graphite cloth starting material is again used to produce a growth of silicon nanowires on the starting substrate. The growth on the substrate is exposed to bone marrow cells and the cells are subsequently cultured.

The above as well as additional objectives, features, and advantages of the present invention will become apparent in the following detailed written description.

BRIEF DESCRIPTIONS OF THE DRAWINGS

DETAILED DESCRIPTION OF THE INVENTION

Figure 1:
FIG. 1 is a view of a graphite cloth starting substrate at enlargement of X20.

The present invention provides a relatively simple and uncomplicated method for producing semiconductor nanowires, and more specifically, silicon nanowires. For a frame of reference, the term "nanowire", as used in the discussion which follows, generally refers to any elongated conductive or semiconductive material that includes at least one cross sectional dimension that is less than 500 nm and has an aspect ratio (length:width) of greater than 10, possibly even greater than 100. For example, in the preferred embodiment of the present invention, nanowires are grown which are on the order of 100-250 nm in width and tens of micrometers in length.

In the method of the invention, a high surface area growth of semiconductor nanowires is obtained on a conducting substrate. A selected graphite material, preferably a commercially available graphite cloth, is provided as the conducting substrate. The semiconductor nanowire is grown on the substrate and then detached from the substrate. The commercially available graphite cloth can be obtained from a number of sources. For example, POCO Graphite of Decatur, Tex., sells a 5 micron particle size sheet material with a uniform microstructure that resists wear and has good thermal conductivity for dimensional stability. Example dimensions are on the order of 0.100×4"×6 for the on-the-shelf product.

In an example laboratory run, a thin gold film twenty nanometers thick is deposited via RF sputtering onto a ~0.7 cm×1.0 cm piece of commercially-available graphite fabric (mass ~10 mg). The graphite cloth has a number of properties which make it an ideal starting substrate for purposes of the present method. For example, the graphite is a good conductor of electricity. The material also has strong adhesion properties due to its high porosity and microroughness. In the next step in the method, the modified graphite cloth is then exposed to dilute silane (0.5% $SiH_4$ diluted in He) with a flow rate of 40 sccm at 600° C. for 20 minutes, resulting in a uniform coating of Si nanowires; the average dimension of the nanowires is approximately 175 nanometers in width and tens of micrometers in terms of length.

Next, the nanowires are detached from the graphite cloth. The detached nanowires provide an optimal location to grow a desired mineral film that can be transferred to known tissue engineering substrates. In one embodiment of the invention, silicon nanowires are grown according to the procedure described above, except the transfer process best takes place with nanowires grown initially on a silicon wafer substrate. A silicon nanowire wafer sample is placed into an oven at 120° C. for approximately 30 minutes. Next, it is removed from the oven and immediately a 2 cm by 1 cm piece of porous polycaprolactone (PCL) sponge is pressed against it. The PCL sponge is removed by pulling the sponge parallel to the silicon wafer surface. The presence of the brown nanowires is immediately apparent against the background of the off-white polymer surface.

Figure 2:
FIG. 2 is a view of the same graphite cloth with nanowires grown on the substrate at enlargement of X1,000.
Figure 3:
FIG. 3 is an enhanced view of the graphite cloth with nanowires at enlargement of X2,000.

With reference to FIG. 1 of the drawings, there is shown a microphotograph of a graphite cloth substrate, at enlargement of 20X, showing the growth of silicon nanowires on the surface of the cloth. This is the standard substrate used during the procedures outlined above. FIG. 2 is similar to FIG. 1 but at an enlargement of 1,000X. FIG. 3 is a further enlargement of the surface of the graphite cloth at 2,000X, showing a uniform growth of silicon nanowires coating the entirety of the sample area of the graphite cloth.

The present invention also teaches a method for uniform growth of calcified mineral phases on such nanowire surfaces through the following typical procedure. Silicon nanowires are grown on graphite cloth, in the same process involving the thin gold film deposited via RF sputtering and exposure to silane, as described above. The nanowires are detached from the substrate by any convenient means, for example, through the use of the PCL sponge previously described. The nanowires are then exposed to a media solution formed of a preselected ingredient or ingredients which promotes the growth of a desired mineral film uniformly coating the nanowires. The media solution can be one which contributes ions in solution, the ions being, for example, $Ca^{+2}$, $PO_4^{3-}$, or $CO_3^{2-}$. Preferably, the media solution is selected from among acellular simulated body fluid (SBF), $CaCl_2$ in solution, and calcium phosphate in solution. The SBF media has ion concentrations almost equal to those of the human blood plasma, making it a convenient media for the biomaterial applications which follow.

For purposes of the present discussion, the nanowires previously grown on graphite cloth were placed in a solution of SBF, comprised of 142.0 mM $Na^+$, 5.0 mM $K^+$, 1.5 mM $Mg^{2+}$, 2.5 mM $Ca^{2+}$, 148.8 mM $Cl^-$, 4.2 mM $HCO_3^-$, 1.0 mM $HPO_4^{2-}$, and 0.5 mM $SO_4^{2-}$, buffered to pH of 7.4. The media was then subjected to an electrical bias of 10 mA applied for 2 hours. At this point, the bias is stopped, and the nanowires are allowed to soak in the simulated plasma for 7 days at 37° C. The sample is then removed from the solution, rinsed thoroughly with distilled water, and allowed to dry. The following table provides some of the experimental values used in growing CaP on the silicon nanowires with a graphite cloth as the substrate.

TABLE I

Table 1: Experimental Values Used in Growing CaP

| | | Bias | | | Soaking | |
|---|---|---|---|---|---|---|
| Sample | Media | Current (mA) | Time (hour) | Voltage (volt) | Time | Media |
| 1 | SBF | 5 | 1.5 | 5 | 1 week | SBF |
| 2 | | 5 | 2 | 5.4 | | |
| 3 | | 10 | 1.5 | 7.0 | | |
| 4 | | 10 | 2 | 6.5 | | |

For uniform growth of calcified mineral phases on such nanowire surfaces embedded in porous polycaprolactone, or any known biopolymer, the present invention teaches a typical procedure as follows. Prior to transfer to the biopolymer surface, the nanowires attached to the silicon wafer are exposed to solution of SBF with an applied electrical bias of 1.0 mA for two hours, then removed and rinsed with distilled water. After the nanowires are transferred to a biopolymer surface, a 2 cm by 1 cm piece of this nanowire-containing biopolymer is placed in a solution of acellular simulated body fluid for one week at 37° C. The sample is then removed from the solution, rinsed thoroughly with distilled water, and allowed to dry. The following table outlines the specific experimental values used as the bias for the silicon nanowires in different media solutions:

TABLE II

Table II: Experimental Values Used as the Bias for Silicon Nanowires

| | | Bias | | |
|---|---|---|---|---|
| Sample | Media | Current | Voltage | Time |
| 1 | $CaCl_2$ (2.5 mM) | 1 mA | 11.5 V | 2 hours |
| 2 | SBF | 5 mA | 5.8 V | |
| 3 | SBF (no buffer) | 5 mA | 5.0 V | |

Figure 5:
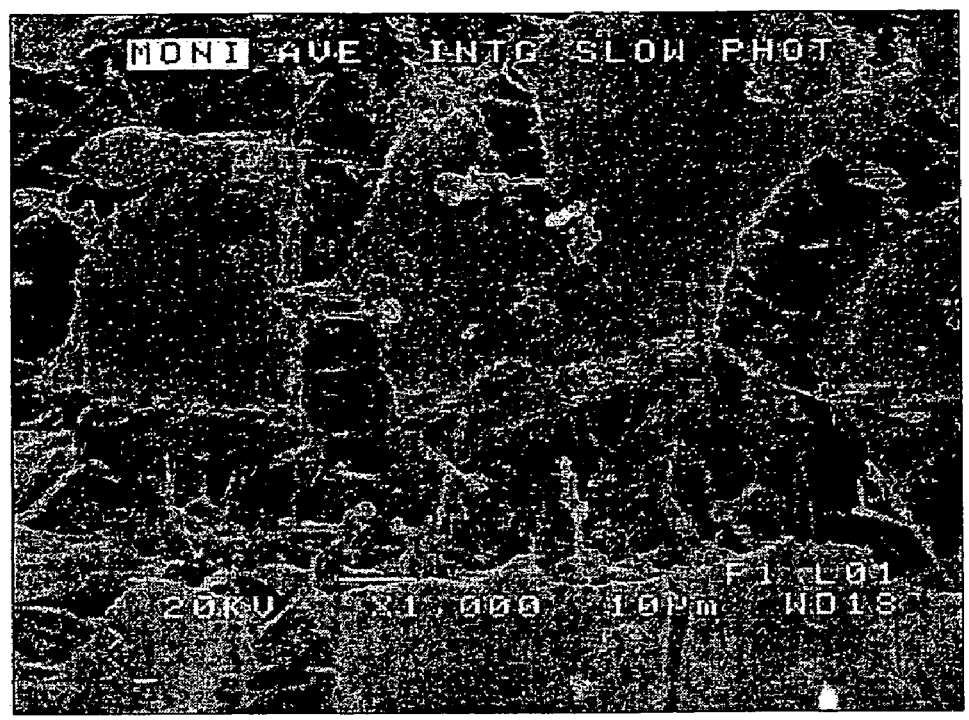
FIG. 5 illustrates the subsequent growth of relatively large plates on the nanowires, at an enlargement of X1,000.

It was observed that the application of a known electrical bias for a selected time interval defines and exposure time sufficient to promote the growth of the desired calcified mineral phase onto the nanowire surfaces. Increasing the exposure time was observed to promote a more uniform growth of mineral phase which ultimately forms thick plates (see FIG. 5).

For silicon nanowire surfaces attached to graphite, the identity of the calcified phase may be altered by changing the identity of the immersion (media) solutions when electrical bias is applied. In other words, the surface chemistry has been found to control the type of film formed. For example, a solution containing only calcium chloride, composed of 2.5 mM concentration, maybe used instead of SBF during the 10 mA bias period of two hours. As a result, the phase that is isolated on the nanowires after the additional one week soak in SBF is found to be calcium carbonate rather than calcium phosphate. In other cases, altering the surface chemistry resulted in the formation of deposits in the form of spherical bodies. It is important to note, all other processing steps for this method are identical to the above methods: at the point the bias is stopped, the nanowires are allowed to soak in the simulated plasma for 7 days at 37° C. The sample is then removed from the solution, rinsed thoroughly with distilled water, and allowed to dry, etc..

To achieve incorporation of anti-osteoporotic drugs of the general class known as bisphosphonates onto the surface of the nanowires, the process identified in the description above is modified slightly as follows. After the initial 10 mA bias in SBF, the nanowires attached to the graphite are soaked in a 2.5 mM solution of a specific bisphosphonate, such as Fosamax™, for 3 days. Next, they are rinsed with D.I. water and allowed to soak into SBF solution for a week, followed by another rinse and drying step. The following table outlines the experimental values used in the bias and soaking of the samples.

TABLE III

Table 3: Experimental Values Used in Bias and Soaking

| Sample | Bias | | | | | Soaking | |
| --- | --- | --- | --- | --- | --- | --- | --- |
| | media | current | voltage | time | ALD | media | time |
| 1 | SBF | 10 mA | 7.0 V | 1 hour | 3 days | SBF | One week |
| 2 | | | 5.6 V | 2 hours | | | |
| 3 (control) | | | 5.8 V | 2 hours | None | | |
| 4 | CaCl$_2$ (2.5 mM) | 1.5 mA | 8.9 V | 1 hour | 3 days | | |
| 5 | | | 6.7 V | 2 hours | | | |
| 6 (control) | | | 5.5 V | 2 hours | None | | |

Figure 4:
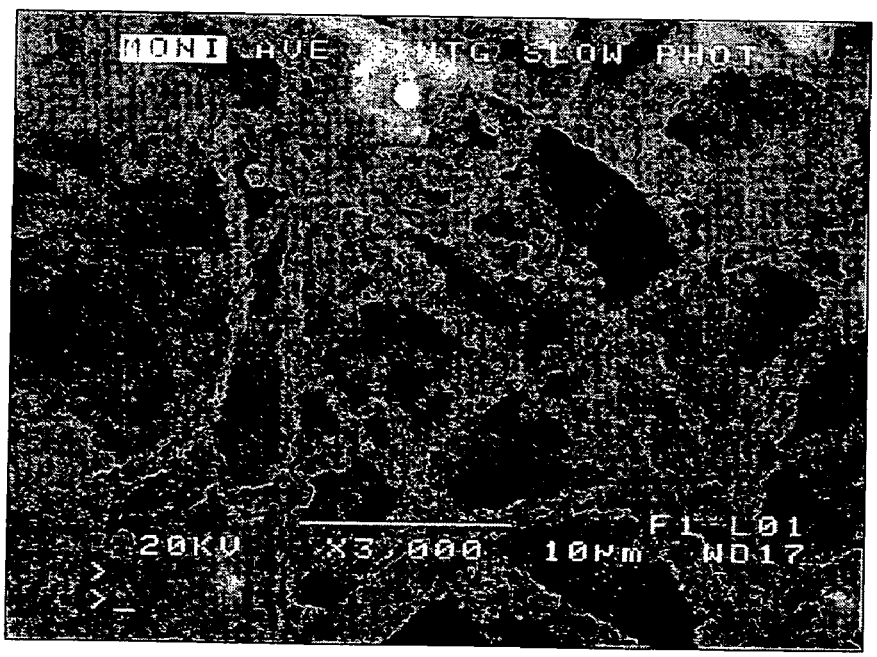
FIG. 4 shows a uniform growth of hydroxyapatite on such nanowires at an enlargement of X3,000.

The bisphosphonate Fosamax™ is commercially available from Merck. Fosamax™, also known as alendronate sodium, is a bisphosphonate that acts as a specific inhibitor of osteoclast-mediated bone resorption. Bisphophonates are synthetic analogs of pyrophosphate that bind to the hydroxyapatite found in bone. The examples of the inventive method described above include this chemical composition for its use in treating osteoporosis and several other bone diseases, due to its ability to block osteoclast-mediated bone-resorption. Alendronate sodium is a white, crystalline, nonhygroscopic powder. FIG. 4 is a microphotograph showing a uniform growth of hydroxyapatite on the nanowires of the invention.

Growth of an anti-bacterial agent such as zinc oxide on these nanowire surfaces is achieved by use of the following typical conditions. A nanowire film, heated to 500° C. in a flowing atmosphere of helium at 3000 sccm, is exposed to vapor of zinc acetylacetonate hydrate for approximately 3 hours. The sample is then cooled to room temperature.

For evaluating the properties of these nanowire materials in the presence of bone-forming cells, the following protocol was utilized. Conducting substrates containing the nanowires are first sterilized by soaking the materials in 70% ethanol for 24 hours, followed by a 5 minute sterile DI water rinse, and UV light exposure for one hour. Each sample is then exposed to 10,000 multipotent mouse bone marrow cells derived from a stromal precursor. The cells can differentiate into osteoblasts, chondrocytes and adipocytes in the presence of appropriate stimulus and environment. Cells are cultured using Dulbecco's modified Eagle's medium with 4 mM L-glutamine adjusted to contain 1.5 g/L sodium bicarbonate and 4.5 g/L glucose, 90% fetal bovine serum, 10% at the standard temperature of 37° C.

Figure 6:
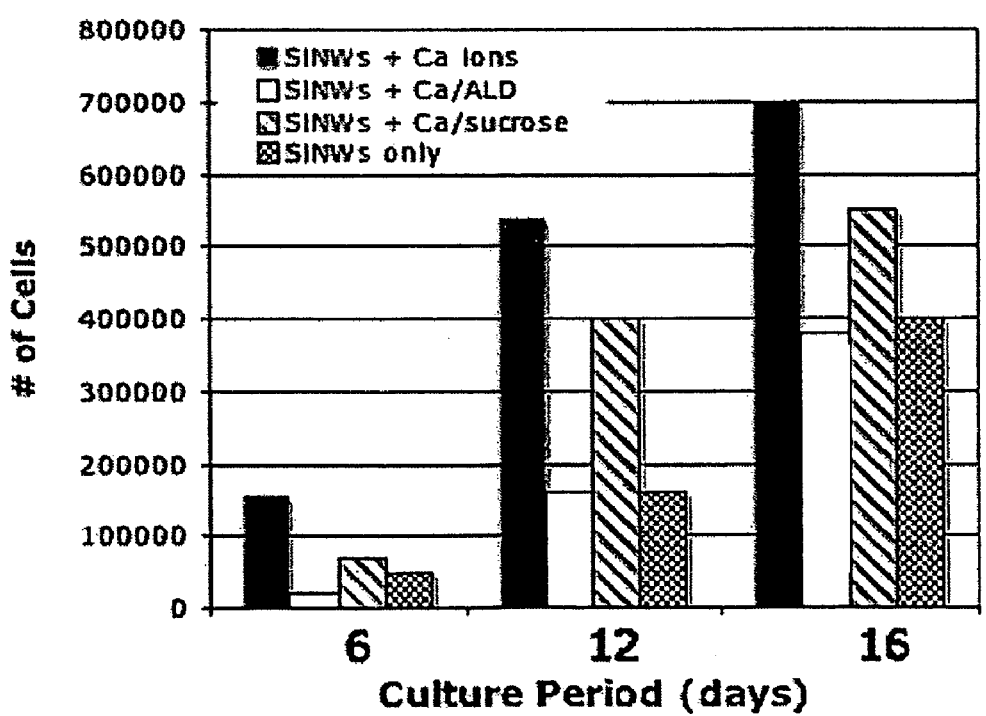
FIG. 6 is a graph illustrating the ability of the surface modified nanowires to mediate stem cell growth in different culture mediums.

An evaluation of the success in encouraging cell culture with modified silicon nanowires as outlined above was then conducted. The materials are divided into 4 wells each containing a different soaking solution. Well 1 contained silicon nanowires with Ca ions bound to their surface; well 2 contained silicon nanowires with Ca ions bound to the surface, followed by a layer of adsorbed alendronate (ALD); well 3 contained silicon nanowires with Ca ions bound to the surface, followed by a layer of a bisphosphonate sucrose derivative; and well 4 contained silicon nanowires control only. The results are illustrated in the graph presented as FIG. 6 of the drawings.

An invention has been provided with several advantages. The method of the invention provides a relatively simple and inexpensive technique for promoting high surface area growth of silicon nanowires on a conducting substrate. A uniform growth of a desired mineral phase may be deposited on the nanowire substrates. Calcified mineral phases associated with bone and their cytocompability can be produced. The phase identity of the mineral film so deposited can be altered through proper surface modification of the nanowires. Such modification includes, for example, modification with orthopedically relevant anti-osteoporodic drug moieties or anti-bacterial components. Certain of the surfaces produced according to the teachings of the invention facilitate the adsorption and mediate the proliferation of mesenchymal stem cells, such cells being capable of differentiation into bone forming osteoblast cells.

While the invention has been shown in several of its forms, it is not thus limited but is susceptible to various changes and modifications without departing from the spirit thereof.

I claim:

1. A method of producing high surface area growth of semiconductor nanowires on conducting substrates, the method comprising the steps of:
    providing a selected graphite material as a starting substrate;
    growing a semiconductor nanowire on the starting substrate;
    detaching the nanowires from the substrate; and
    wherein the nanowires are detached from the substrate by pressing and pulling with a porous polymeric body.

2. The method of claim 1, wherein the polymeric body is a porous polycaprolactone sponge.

3. A method of producing a uniform growth of calcified mineral phases on nanowire surfaces, the method comprising the steps of:
    producing a selected graphite material as a starting substrate:
    growing a semiconductor nanowire in the starting substrate:
    detaching the nanowire from the substrate: exposing the detached nanowires to a media solution formed of selected ingredients which promote the growth of a desired mineral film uniformly covering the nanowires: and
    wherein the method further comprises the steps of:
    applying a known electrical bias for a selected time interval sufficient to promote the growth of the desired calcified mineral phase on the nanowire surfaces;
    removing the electrical bias at the end of the time interval;
    allowing the nanowires to soak in the media solution to produce a specimen sample; and
    removing the sample and allowing the sample to dry.

4. The method of claim 3, wherein the media solution is selected from the group consisting of:

5. The method of claim 3, wherein the media solution is one which contributes ions in solution, the ions being selected from the group consisting of:
$Ca^{+2}$, $PO_4^{3-}$, and $CO_3^{2-}$.

6. The method of claim 3, wherein the application of the known electrical bias for the selected time interval defines an exposure period sufficient to promote the growth of the desired calcified mineral phase on the nanowire surfaces, and wherein increasing exposure time promotes a more uniform growth of mineral phase which ultimately forms thick plates.

7. A method of producing high surface area growth of semiconductor nanowires on conducting substrates, the method comprising the steps of:
    producing a selected graphite material as a starting substrate;
    growing a semiconductor nanowire in the starting substrate;
    detaching the nanowire from the substrate; exposing the detached nanowires to a media solution formed of a preselected ingredient which promotes the growth of a desired mineral film uniformly covering the nanowires; and wherein the desired mineral film is calcium phosphate, the film subsequently being used as a bone medium.

8. The method of claim 7, wherein increasing the exposure time of the detached nanowires in the media solution promotes uniform growth and forms thick plate deposits of the mineral film.

9. The method of claim ,7 wherein the use of a different media solution produces deposits in the form of spherical bodies.

10. A method for surface modification of nanowires with orthopedically relevant drug moieties and/or anti-bacterial components, the method comprising the steps of:

producing a selected graphite material as a starting substrate;

growing a semiconductor nanowire in the starting substrate;

detaching the nanowire from the substrate;

exposing the detached nanowires to a media solution formed of preselected ingredients which promote the growth of a desired mineral film uniformly covering the nanowires; and incorporating the desired orthopedically relevant drug moieties and/or anti-bacterial component within the mineral film.

11. The method of claim 10, wherein the desired orthopedically relevant drug moiety and/or anti-bacterial component is incorporated into the mineral film by soaking the mineral coated nanowire in a solution of the drug moiety or anti-bacterial component and applying an electrical bias to the solution 12. The method of claim 11, wherein the graphite cloth is exposed to silane in a gas stream and heated to a selected temperature for a predetermined time interval.

13. The method of claim 11, Wherein an anti-osteoporotic drugs is incorporated onto the surface of the nanowires following the electrical bias by soaking the nanowires in a solution of a selected bisphosphonate.

14. The method of claim 10, wherein an anti-bacterial agent is incorporated onto the surface of the nanowires by heating the nanowires in a flowing atmosphere of helium, exposing the nanowires to a zinc acetylacetonate hydrate, and thereafter cooling the nanowires to room temperature.

15. The method of claim 14, wherein the nanowires are heated in the range of 450° to 550° C.

* * * * *